US012631704B2

(12) United States Patent
Biber et al.

(10) Patent No.: US 12,631,704 B2
(45) Date of Patent: May 19, 2026

(54) THERMAL BUS STRUCTURE FOR A MAGNETIC RESONANCE IMAGING DEVICE

(71) Applicant: Siemens Healthcare Limited, Camberley (GB)

(72) Inventors: Stephan Biber, Erlangen (DE); Nicholas Aley, Maldon (GB)

(73) Assignee: Siemens Healthcare Limited, Camberley (GB)

( * ) Notice: Subject to any disclaimer, the term of this patent is extended or adjusted under 35 U.S.C. 154(b) by 109 days.

(21) Appl. No.: 18/215,870

(22) Filed: Jun. 29, 2023

(65) Prior Publication Data
US 2024/0004008 A1 Jan. 4, 2024

(30) Foreign Application Priority Data
Jun. 29, 2022 (EP) .................................... 22275082

(51) Int. Cl.
*G01R 33/38* (2006.01)
*G01R 33/3815* (2006.01)
*G01R 33/421* (2006.01)

(52) U.S. Cl.
CPC ..... *G01R 33/3804* (2013.01); *G01R 33/3815* (2013.01); *G01R 33/4215* (2013.01)

(58) Field of Classification Search
CPC ............ G01R 33/3804; G01R 33/3815; G01R 33/4215; G01R 33/3856
See application file for complete search history.

(56) References Cited

U.S. PATENT DOCUMENTS

| | | | |
|---|---|---|---|
| 2010/0242500 A1* | 9/2010 | Laskaris | ................. F28D 15/02 |
| | | | 324/318 |
| 2014/0274722 A1 | 9/2014 | Calvert et al. | |
| 2016/0178716 A1* | 6/2016 | Lvovsky | ................... H01F 6/04 |
| | | | 324/318 |
| 2020/0049779 A1* | 2/2020 | Overweg | ............... G01R 33/56 |
| 2021/0223339 A1* | 7/2021 | Zou | ..................... G01R 33/4215 |
| 2024/0004009 A1 | 1/2024 | Thomas et al. | |

FOREIGN PATENT DOCUMENTS

| | | |
|---|---|---|
| GB | 2490189 A | 10/2012 |
| WO | 2015189786 A1 | 12/2015 |

* cited by examiner

*Primary Examiner* — Daniel R Miller
(74) *Attorney, Agent, or Firm* — Banner & Witcoff, Ltd.

(57) ABSTRACT

A magnetic resonance imaging device including a main magnet, a gradient system with at least one gradient coil, a cryocooler, a thermal bus structure, and an electromagnetic shield arranged between the gradient system and the main magnet. The electromagnetic shield includes spaced shield elements. The electromagnetic shield is configured to provide an electromagnetic shielding of the main magnet from a magnetic field generated by the at least one gradient coil. The thermal bus structure includes thermal bus elements configured to provide a thermal connection between the plurality of spaced shield elements and a cold head of the cryocooler. At least two thermal bus elements of thermal bus elements include different heat transfer properties to provide individualized temperature control of the spaced shield elements.

13 Claims, 5 Drawing Sheets

THERMAL BUS STRUCTURE FOR A MAGNETIC RESONANCE IMAGING DEVICE

TECHNICAL FIELD

The disclosure relates to a magnetic resonance imaging device comprising a main magnet, a gradient system with at least one gradient coil, a cryocooler, a thermal bus structure, and an electromagnetic shield arranged between the gradient system and the main magnet. The electromagnetic shield comprises a plurality of spaced shield elements and is configured to provide an electromagnetic shielding of the main magnet from a magnetic field generated by the at least one gradient coil.

BACKGROUND

Magnetic resonance tomography represents a prominent imaging method for acquiring images of an interior of an examination object. For carrying out a magnetic resonance measurement, the examination object is usually positioned in a strong and homogeneous static magnetic field (B0 field) of a magnetic resonance imaging device. The static magnetic field may comprise magnetic field strengths of 0.2 Tesla to 7 Tesla, thus aligning nuclear spins inside the examination object along the static magnetic field. For triggering so-called nuclear spin resonances, radiofrequency excitation pulses are emitted into the examination subject. Each radiofrequency excitation pulse causes a magnetization of nuclear spins within the examination object to deviate from the static magnetic field by an amount which is known as the flip angle. A radiofrequency excitation pulse may comprise an alternating (electro-)magnetic field with a frequency that corresponds to the Larmor frequency at the respective static magnetic field strength. Excited nuclear spins may exhibit a rotating and decaying magnetization (nuclear magnetic resonance), which can be detected using dedicated radiofrequency antennas. For spatial encoding of measured data, rapidly switched magnetic gradient fields are superimposed on the static magnetic field.

The received nuclear magnetic resonances are typically digitized and stored as complex values in a k-space matrix. This k-space matrix can be used as a basis for the reconstruction of magnetic resonance images and for determining spectroscopic data. A magnetic resonance image is typically reconstructed by means of a multi-dimensional Fourier transformation of the k-space matrix.

Magnetic gradient fields are typically generated via dedicated gradient coils. These gradient coils are configured to produce transient or dynamic magnetic gradient fields in an imaging region of the magnetic resonance imaging device. Inevitably, such gradient coils produce magnetic stray fields which may undesirably interact with a main magnet providing the static magnetic field. Particularly, when fast-changing magnetic stray fields from the gradient coils pass through a conductive material of the main magnet, such as coils of a superconductor or an electromagnet, eddy currents are produced. These eddy currents can cause Ohmic heating and create magnetic fields.

For reducing the impact of magnetic stray fields generated by the gradient coils on the main magnet, active and passive electromagnetic shields have been employed. While active electromagnetic shields can significantly decrease the impact of magnetic stray fields from the gradient coils on the main magnet, they require cooling as well as additional space within a magnet arrangement of the magnetic resonance imaging device, thus increasing the distance between the main magnet and a center of the imaging region. Due to the increased distance, the generation of the main magnetic field may be less efficient.

Attempts have been made to reduce the footprint of the electromagnetic shielding for the gradient coils, e. g. by separating the electromagnetic shield into several disjoint structures. However, depending on the magnetic gradient fields applied, eddy currents within the disjoint structures may vary and cause temperature variations within the electromagnetic shield. These temperature variations undesirably change the electrical conductivity of individual disjoint structures and impact the respective eddy current amplitudes as well as their time constants. As a result, varying eddy fields generated by individual structures of the electromagnetic shield superimpose within the imaging region, thus causing imaging artifacts that are difficult to address with conventional methods for eddy-current-compensation.

SUMMARY

It is therefore an object of the disclosure to improve a thermal design of an electromagnetic shield of a magnetic resonance imaging device.

This object is achieved by a magnetic resonance imaging device according to the disclosure.

The disclosed magnetic resonance imaging device comprises a main magnet, a gradient system with at least one gradient coil, a cryocooler, a thermal bus structure, and an electromagnetic shield arranged between the gradient system and the main magnet.

In one aspect, the disclosed magnetic resonance imaging device is configured to acquire magnetic resonance data from an object positioned within an imaging region of the magnetic resonance imaging device. Preferably, the magnetic resonance imaging device is configured to acquire magnetic resonance image data, particularly diagnostic magnetic resonance image data, from the object positioned within the imaging region. The object may be a patient, particularly a human or an animal.

Preferably, the disclosed magnetic resonance imaging device is a closed-bore scanner. A closed bore scanner may comprise a substantially cylindrical bore circumferentially enclosing the imaging region wherein the object may be placed. The main magnet of the closed bore scanner may comprise one or more solenoidal coils encompassing the imaging region along an axial direction of the cylindrical bore. The one or more solenoidal coils may comprise a wire having negligible electrical resistance below a superconducting temperature. A direction of the main magnetic field provided via the main magnet may be oriented substantially in parallel to the direction of access of the object to the imaging region and/or the axial direction of the cylindrical bore.

In an alternative aspect, the disclosed magnetic resonance imaging device is an open-bore scanner. Open bore scanners may be characterized by a magnetic field generation unit that is split into two parts confining the imaging region in two substantially opposing directions. The direction of the main magnetic field may be oriented perpendicular or at a non-zero angle to a direction of access of the imaging object into the imaging region.

The main magnet may comprise or consist of one or more electromagnets or superconducting magnets.

The gradient system comprises one or more gradient coils. A gradient coil may be configured to generate a magnetic gradient field in the imaging region. In a preferred aspect, the gradient system comprises at least a first gradient coil and a second gradient coil. The first gradient coil may be configured to generate a first magnetic gradient field in the imaging region. Likewise, the second magnetic gradient coil may be configured to generate a second magnetic gradient field in the imaging region. The first magnetic gradient field may be oriented essentially perpendicular to the second magnetic gradient field. The gradient system may further comprise a third gradient coil configured to generate a third magnetic gradient field within the imaging region. It is conceivable, that the third magnetic gradient field is oriented substantially perpendicular to the first magnetic gradient field and the second magnetic gradient field.

The cryocooler may be configured for cooling components of the magnetic resonance imaging device. For example, the cryocooler may be configured for cooling the main magnet, the gradient system, the thermal bus structure, and/or the electromagnetic shield. In a preferred aspect, the cryocooler is configured to provide a temperature below a superconducting temperature of a superconducting material of a main magnet. The cryocooler may comprise a cold head with one or more stages with different temperature levels. The cryocooler may be implemented as a pulse tube refrigerator, a Gifford-McMahon refrigerator, a Stirling cryocooler, a Joule-Thomson cooler, or the like.

The magnetic resonance imaging device may also comprise a cryostat. The cryostat may be any kind of sealed container, which is configured to store or preserve a fluid, preferably a cryogen, at a predefined temperature level. The predefined temperature level may substantially correspond to a superconducting temperature of the main magnet. For example, a superconducting temperature of the main magnet may be in the range of 3 K to 100 K, preferably in the range of 3 K to 5 K, 30 K to 60 K, or 60 K to 90 K. The cryostat may comprise thermal insulation configured for reducing an input of heat energy from components of the magnetic resonance imaging device and/or an environment of the magnetic resonance imaging device. In a preferred aspect, the cryostat contains a fluid or a cryogen with a low boiling point like argon, nitrogen, neon, helium (e. g. in a gaseous form) and the like. The cryostat may be thermally connected to the cold head, preferably via a solid thermal conductor and/or a heat pipe.

It is also conceivable, that the disclosed magnetic resonance imaging device is a "dry system" comprising a minimum amount of cryogen or no cryogen at all. For example, the main magnet may be cooled via thermal conduction. In this case, the magnetic resonance imaging device may comprise a vacuum vessel configured to keep the main magnet at a desired temperature level by reducing a thermal heat load to an acceptable level. Any thermal buffer usually provided by a liquid cryogen may be provided by a solid material with a sufficiently high thermal mass. Examples of such solid materials are Copper, Aluminium, Bismuth, or the like. For example, at a temperature level of 4 K, this solid material may comprise or consist of a combination of rare earth materials, such as Gadolinium Oxysuplphate (GOS), HoCu, or the like. The composition may be tuned to give a peak in heat capacity at a desired temperature level.

The electromagnetic shield comprises a plurality of spaced shield elements confining the main magnet in a direction facing toward the gradient system. The plurality of spaced shield elements may consist of a material with high electrical and/or high thermal conductivity. For example, the shield elements may consist of copper or aluminium, particularly high-purity aluminium. The shield elements may also comprise gold, platinum, or other materials with high thermal conductivity. It is conceivable that the shield elements are coated or galvanized with gold, platinum, or other metals with high thermal conductivity.

In a preferred aspect, the shield elements are shaped in such a way as to conform to the shape of the main magnet. For example, a surface contour of a shield element may imitate or conform to the surface contour of the main magnet.

In one aspect, an imaginary envelope curve encompassing the main magnet comprises the shape of a hollow cylinder. In this case, the shield elements may be shaped as rings. An outer surface of the rings may conform to an inner surface of the imaginary envelope curve encompassing the main magnet. The rings may be spaced apart in regular or irregular intervals in a direction along an axis of the hollow cylinder. The rings may be characterized by a substantially circular shape. Such an arrangement of the plurality of spaced shield elements may be particularly suitable for closed-bore scanners.

In a further aspect, a ring-shaped shield element may be arranged adjacent to a ring-shaped coil of the main magnet along an axis of rotational symmetry defined by the ring-shaped coil of the main magnet. An outer diameter of the ring-shaped shield element may exceed an inner diameter of the ring-shaped coil of the main magnet. In a similar arrangement, the shield element may also comprise the shape of a disk or a prism. For example, a cross-section of the shield element may be oval, rectangular, or polygonal. Such an arrangement of the plurality of spaced shield elements may be suitable especially for open bore scanners, but also closed bore scanners.

Depending on the shape and/or arrangement of the main magnet and/or the geometry of the magnetic resonance imaging device, the shield elements may have arbitrary shapes which may differ from a ring shape described above for explanatory purposes.

The electromagnetic shield is configured to provide an electromagnetic shielding of the main magnet from a magnetic field generated by the at least one gradient coil.

The electromagnetic shield may be configured to shield the main magnet from magnetic fields generated via the gradient system. A shielding effect of the electromagnetic shield may be based on the absorption of electromagnetic fields in the shield elements. However, the shielding effect may also be based on reflexion of electromagnetic radiation in an interfacial layer or boundary layer of a surface of the shield element.

As the shield elements of the electromagnetic shield are spaced apart, stray fields from the gradient system may still have an impact on the main magnet. However, the shield elements may be configured to decrease the impact of the stray field of the gradient system on the main magnet by at least 60%, at least 70% or at least 80%.

For example, the main magnet of a closed bore scanner may comprise a plurality of axially spaced ring-shaped coils. In this case, the plurality of spaced shield elements may be arranged at intervals corresponding to the intervals of the axially spaced ring-shaped coils. Preferably, the shield elements are configured as axially spaced ring elements. A width of a ring element may correspond to a width of a ring-shaped coil of the main magnet at a corresponding axial location. However, the width of a ring element may also exceed or fall short of the width of a ring-shaped coil of the main magnet. In one aspect, the distance between two ring elements may differ from the distance between to ring-shaped coils of the main magnet. It is also conceivable that a quantity of shield elements differs from a quantity of ring-shaped coils. In a preferred aspect, the quantity of shield elements corresponds to the quantity of ring-shaped coils of the main magnet.

The thermal bus structure comprises a plurality of thermal bus elements configured to provide a thermal connection between the plurality of spaced shield elements and a cold head of the cryocooler.

The thermal bus structure may be characterized by a network formed by the plurality of thermal bus elements. Preferably, the plurality of thermal bus elements is mechanically and thermally connected to a common structure, e. g. a thermal backbone. In one aspect, the thermal bus structure is a single piece, wherein individual thermal bus elements branch out to provide a thermal connection with the plurality of spaced shield elements. The thermal bus structure and the thermal bus elements may be materially connected.

In a further aspect, the thermal bus elements are mechanically and thermally connected to the thermal bus structure. A thermal connection between the thermal bus elements and the thermal bus structure may be provided via a solder joint, a thermally conductive adhesive, a heat-conductive paste, a press-fitting, a screw connection, a bolted connection, or any other suitable mechanical connection. A thermal connection between a thermal bus element and a shield element may be implemented accordingly.

It is conceivable that individual thermal bus elements form a bridge between the thermal bus structure and individual shield elements.

In one aspect, the thermal bus elements are implemented as a part or a section of the shield elements. Thus, the thermal bus elements may represent a portion or section of the shield elements. For example, the thermal bus structure may be thermally connected to the plurality of thermal bus elements forming parts or sections of the shield elements.

As a further option, one or more thermal bus elements may provide a thermal connection between two or more shield elements. For example, a thermal bus element may provide a thermal connection between a first shield element and a second shield element. Thus, the thermal bus elements may be configured to transfer heat energy between the first shield element and the second shield element.

According to an aspect, at least one thermal bus element comprises a solid thermal conductor or a heat pipe. Preferably, the thermal bus elements consist of solid thermal conductors. A material of the thermal conductors may correspond to a material of a shield element according to an aspect described above. For example, the thermal bus element may be made of aluminium or copper. It is also conceivable that non-electrically conducting materials are used, such as carbon, ceramics, and/or composite materials. In using a solid thermal conductor, costs may favourably be decreased, and/or the durability of the thermal bus structure may favourably be increased.

However, the thermal bus element may also comprise or consist of a heat pipe. A heat pipe may comprise a working fluid sealed in a tube that is closed at both ends. The heat pipe may be configured to absorb heat energy at a first end of the tube, causing the working fluid to evaporate and transport the heat energy to a second end of the tube, where the working fluid condenses. Temperature and pressure differences between the first end and the second end of the tube may accelerate heat transport within the tube and surpass conventional heat conduction in a solid material significantly. Examples of suitable working fluids are Helium, Argon, Neon, Nitrogen, and the like.

It is also conceivable, that the at least one thermal element comprises solid Nitrogen embedded or enclosed in a solid thermal conductor. Nitrogen has a melting point of about 63 K at 1 atmosphere, whereas the temperature of the thermal bus structure may be in the range between 40 to 60 K. It is conceivable that the solid Nitrogen acts as a phase change material configured for absorbing high amounts of heat energy when melting whilst maintaining a temperature level within a range of a few Kelvin.

In providing one or more thermal bus elements comprising solid Nitrogen, the thermal capacity of the thermal bus structure may favourably be increased. Thus, the thermal bus structure may act as a thermal buffer, mitigating or minimizing the impact of high heat loads.

At least two thermal bus elements of the plurality of thermal bus elements comprise different heat transfer properties for providing individualized temperature control of the plurality of spaced shield elements.

According to an aspect, a heat transfer property of a thermal bus element is characterized by a thermal conductivity, a thermal resistance, a thermal insulance, a heat transfer coefficient, a material, a material composition, a shape, and/or a temperature of the bus element.

The heat transfer property of the thermal bus element is dependent on a temperature as well as a material, a shape, and/or mechanical configuration of the thermal bus element. It is also conceivable, that the heat transfer property of the thermal bus element is impacted by an adjusting unit. An adjusting unit may be a heat switch, a heating unit, a buffer tank, and/or a secondary cooling device, connected to the thermal bus element. However, an adjusting unit may be any device or component suitable for adapting a heat transfer property of a thermal bus element. For example, the adjusting unit may also be configured to adapt a shape and/or a spatial orientation of at least one thermal bus element.

According to an aspect of the disclosed magnetic resonance imaging device, a first heat transfer property of a first thermal bus element thermally connected to a first shield element differs from a second heat transfer property of a second thermal bus element thermally connected to a second shield element.

It is conceivable that a shape of the first thermal bus element differs from a shape of the second thermal bus element to compensate for different heat loads expected in the first shield element and the second shield element. For example, a first diameter of a rod-shaped first thermal bus element may exceed a second diameter of a rod-shaped second thermal bus element to decrease the thermal resistance and/or increase the heat transfer coefficient of the first thermal bus element with respect to the second thermal bus element.

Preferably, the thermal bus structure is designed in such a way that shield elements that are subject to higher heat loads are thermally connected to thermal bus elements with lower thermal resistances. Thus, differing heat loads across the shield elements can favourably be pre-compensated by statically setting heat transfer properties of the respective thermal bus elements, for example by choosing individual shapes and/or material compositions.

According to a further aspect, the thermal bus structure and/or the thermal bus elements are configured to allow for a dynamic compensation of differing heat loads across the plurality of spaced shield elements.

In one example, the first thermal bus element may comprise a heat switch configured to permit or inhibit a heat flow via the first thermal bus element by significantly decreasing thermal conductivity (or increasing thermal resistance). It is conceivable that the heat switch is controlled passively via thermal expansion and/or contraction of the first shield element, the first thermal bus element, and/or a reference component thermally connected to the first shield element and/or the first thermal bus element. However, the magnetic resonance imaging device may also comprise a control unit configured to control the adjusting unit in dependence on an imaging parameter, an imaging sequence, and/or a sensor signal. Thus, different heat loads across the shield elements may favourably be compensated or harmonized by dynamically adapting heat transfer properties of the respective thermal bus elements.

In one aspect, a third heat transfer property of a third thermal bus element thermally connected to a third shield element differs from the first heat transfer property of the first thermal bus element and/or the second heat transfer property of the second thermal bus element. It is conceivable that the thermal bus structure comprises even more thermal bus elements with different heat transfer properties. In a preferred aspect, each thermal bus element of the plurality of thermal bus elements comprises different heat transfer properties to provide individualized temperature control of the plurality of spaced shield elements. Particularly, the thermal resistance of each individual thermal bus element may be tailored to compensate for a typical or expected heat load distribution. For example, a typical or expected heat load distribution may comprise averaged heat loads over a number of sequences and slice orientations.

In providing a plurality of thermal bus elements with different heat transfer properties, individualized temperature control of the plurality of spaced shield elements may be provided. Thus, eddy currents within the plurality of spaced shield elements may be equalized or harmonized in such a way, that an occurrence of dissimilar or varying eddy fields superimposing in the imaging region may be impeded or prevented.

By equalizing eddy currents within the plurality of spaced shield elements, results of conventional eddy current compensation methods may advantageously be improved. Thus, an occurrence of image artefacts may be moderated or prevented and the quality of acquired magnetic resonance images may favourably be improved.

In an aspect of the disclosed magnetic resonance imaging device, the cold head comprises at least a first stage and a second stage, wherein a first mean temperature of the first stage exceeds a second mean temperature of the second stage and wherein the thermal bus structure is thermally connected to the first stage of the cold head.

The cold head may comprise a heat exchanger or a plurality of heat exchangers configured for receiving heat energy from components of the magnetic resonance imaging device, such as the main magnet, the gradient system, the electromagnetic shield, the cryostat, the thermal bus structure and the like. The cold head may be mechanically attached to the cryostat of the magnetic resonance imaging device. In a preferred aspect, the first stage of the cold head is thermally connected to the cryostat.

In a preferred aspect, the thermal bus structure is thermally connected to the first stage of the cold head. The thermal connection between the first stage and the thermal bus structure may be implemented according to an aspect described above.

In an alternative aspect, the thermal bus structure is thermally connected to the second stage of the cold head.

The first stage of the cold head may be characterized by a temperature level in the range between 30 and 90 K, preferably between 40 and 60 K. The second stage of the cold head may be characterized by a temperature level below the superconducting temperature of the main magnet. For example, the second stage may provide a temperature level in the range between 2 and 20 K, preferably between 3 and 8 K.

Thermally connecting the thermal bus structure to the first stage of the cold head may be advantageous, as the first stage of the cold head usually provides a higher cooling power as compared to the second stage. Thus, a heat transfer rate between the electromagnetic shield and the cold head may favourably be increased. Accordingly, the individual shield elements may be kept at substantially constant temperature levels even when heat loads within the shield elements exceed the cooling capacity of the second stage. Thus, a temporal drift of (highly) non-linear eddy fields in the imaging region may be reduced or prevented.

In a further aspect of the disclosed magnetic resonance imaging device, the main magnet comprises a magnet spacer configured to space individual coils of the main magnet.

The magnet spacer may consist of a material that is capable of counteracting and/or resisting the magnetic forces of the main magnet. Preferably, the magnet spacer is configured for ensuring and/or maintaining a predefined positional relationship between the individual coils of the main magnet. For example, the magnet spacer may comprise or consist of a cured resin, a metal, a metal alloy, a ceramic, a composite material, and the like. Preferably, the magnet spacer further comprises electrical insulation configured to prevent a transfer of electrical currents between coils of the main magnet separated via the magnet spacer.

At least a section of the thermal bus structure extends through the magnet spacer for providing a thermal connection between the cold head of the cryocooler and the electromagnetic shield.

The magnet spacer may comprise a hole, a bore, or a cavity extending through a material of the magnet spacer. The thermal bus structure, e. g. a thermal bus element and/or a part of a thermal backbone of the thermal bus structure, may pass through the hole, bore, or cavity in the magnet spacer and extend into a volume encompassed by the main magnet.

In a preferred aspect, the section of the thermal bus structure is thermally separated from the magnet spacer. For example, the section of the thermal bus element may extend through the magnet spacer without contacting the magnet spacer. However, the section of the thermal bus structure and/or the magnet spacer may also comprise a thermally insulating material arranged between the section of the thermal bus structure and the magnet spacer. Preferably, the thermally insulating material is configured for reducing or preventing a heat exchange between the magnet spacer and the section of the thermal bus structure. For example, a thermally insulating material may be made of carbon, carbon fibre, carbon and/or glass fibre reinforced polymer, stainless steel (i. e. rods or thin-walled tubes), syntactic foam (with or without a filler), nested tubes or structures providing a long thermal heat transfer path in a compact structure and the like.

By routing a section of the thermal bus structure through the magnet spacers, an overall dimension or length of the thermal bus structure thermally coupling a shield element to the cold head can favourably be reduced. Thus, a heat transfer rate from the shield elements to the cold head may be increased advantageously. Particularly, a smaller dimension of the thermal bus structure may reduce the thermal resistance of the thermal bus element as well as a time constant for heat transfer via the thermal bus element.

In a preferred aspect, the disclosed magnetic resonance imaging device further comprises a control unit and an adjusting unit, wherein the control unit is configured for adjusting a heat transfer property of at least one thermal bus element via the adjusting unit.

Preferably, the control unit is configured to actively and/or dynamically adjust a heat transfer property of the at least one thermal bus element via the adjusting unit. The control unit may also be configured to adjust a heat transfer property of a second thermal bus element, a third thermal bus element, or a plurality of thermal bus elements via one or more adjusting units. An adjusted heat transfer property of a first thermal bus element preferably differs from an adjusted heat transfer property of a second thermal bus element and/or an adjusted heat transfer property of a third thermal bus element. A heat transfer property may be selected from a list comprising any of the heat transfer properties mentioned above.

It is conceivable that the at least one thermal bus element is formed as a part or a section of a shield element as described above.

The control unit may further be configured to adjust a shape, a positional arrangement, and/or a temperature of the at least one thermal bus element. Particularly, the control unit may be configured to adjust a shape, a positional arrangement, and/or a temperature of one or more sections of the at least one thermal bus element. For example, the adjusting unit may comprise an actuator and/or a motor element configured for adapting a positional arrangement and/or a shape of the at least one thermal bus element, thus adjusting a heat transfer property.

The control unit may correspond to or form a part of a central control unit of the magnetic resonance imaging device. However, the control unit may also be implemented as an independent or self-contained device separate from the central control unit of the magnetic resonance imaging device.

In a preferred aspect, the cooling efficiency of each individual thermal bus element is tuned via the control unit in dependence on an imaging sequence to be performed. A target of a tuning process may comprise keeping the temperature of the shield elements substantially stable. For example, the temperature may be kept at a level where the thermal radiation onto a 4 K level is at an acceptable level and the temperature rise among the different shield elements is even or uniform.

By providing a disclosed control unit, a heat transfer rate of the at least one thermal bus element or a plurality of thermal bus elements may favourably be adjusted to compensate for differing heat loads occurring in the plurality of spaced shield elements, e. g. as a result of an imaging sequence or different imaging sequences performed. Thus, an occurrence of uneven or inhomogeneous eddy fields in the imaging region may advantageously be reduced or prevented.

In one aspect of the disclosed magnetic resonance imaging device the adjusting unit comprises a heating unit thermally connected to the at least one thermal bus element and configured for heating the at least one thermal bus element. The control unit is configured for controlling the heating unit to adapt a heat flow between the heating unit and the at least one thermal bus element.

The heating unit may be configured for heating the at least one thermal bus element, the at least one shield element, and/or at least a section of the thermal bus structure.

A heating unit may be any component or device that is configured for transferring heat energy to the at least one thermal element. Preferably, the heating unit comprises a resistive wire for converting electrical energy into heat energy. However, the heating unit may also comprise a fluid thermally coupled to the at least one thermal bus element via a suitable heat exchanger.

The control unit is configured for controlling the heating unit to adapt a heat flow between the heating unit and the at least one thermal bus element. The heating unit may be configured to adjust the temperature of the at least one thermal bus element in dependence on a control signal provided via the control unit.

In providing a heating unit thermally coupled to the at least one thermal bus element, temperature-dependent heat transfer properties of the at least one thermal bus element may favourably be adjusted with high accuracy. Furthermore, heating units comprising resistive wires may provide a particularly cost-effective solution for adjusting a heat transfer property of the at least one thermal element.

According to a further aspect of the disclosed magnetic resonance imaging device, the adjusting unit comprises a heat switch configured for inhibiting a heat flow via the at least one thermal bus element. The control unit is configured for controlling the heat flow along the at least one thermal bus element via the heat switch.

The heat switch may be configured to thermally separate a first section of the at least one thermal bus element from a second section of the at least one thermal bus element. It is also conceivable, that the heat switch is configured to thermally separate the at least one bus element from its dedicated shield element and/or from the thermal bus structure.

The heat switch may be positioned along a spatial extension of the at least one thermal bus element. For example, the heat switch may be arranged between the first section and the second section. Preferably, the heat switch is configured to block or inhibit thermal conduction or heat transfer between the first section and the second section. Examples of suitable heat switches include a thermosyphon, a heat pipe, a gas gap, but also a solid (e. g. magneto-resistive) or mechanical switch.

Preferably, the heat switch is configured to reversibly inhibit heat transfer via the at least one thermal bus element in dependence on a control signal provided by the control unit. In one aspect, the control unit is configured for engaging and/or disengaging the heat switch. Thus, the heat flow along the at least one thermal bus element may be adjusted in discrete steps.

A heat switch may provide a robust and/or easy-to-control solution for adjusting a heat transfer property of the at least one thermal bus element. Furthermore, the heat switch may favourably be used to directly modify a heat transfer rate along the at least one thermal bus element.

According to a further aspect of the disclosed magnetic resonance imaging device the adjusting unit comprises a secondary cooling device thermally connected to the at least one thermal bus element. The control unit is configured for controlling the secondary cooling device to adjust a heat flow between the secondary cooling unit and the at least one thermal bus element.

The secondary cooling device is configured to receive or absorb heat energy from the at least one thermal bus element. Thus, the secondary cooling device may be configured to adjust the temperature of the at least one thermal bus element. The secondary cooling device may also be thermally connected to a second thermal bus element, a third thermal bus element, and/or the thermal bus structure.

Preferably, the secondary cooling device is a self-contained device different from the cold head of the cryocooler.

In one aspect, the at least one thermal bus element, the second thermal bus element, and/or the third thermal bus element are thermally connected to the secondary cooling device via a heat switch controlled by the control unit. However, the secondary cooling device may also be an active cooling device with an adjustable cooling capacity controlled via the control unit.

Examples of suitable secondary cooling devices are Peltier coolers or Nernst thermoelectric coolers. However, other any other cooling device capable of maintaining a temperature level in the range of 30 to 90 K, preferably 4 to 60 K, may be employed.

By providing a secondary cooling device, the temperature of individual shield elements may favourably be controlled with higher accuracy. Furthermore, a secondary cooling device may provide cooling capacity in addition to a cooling capacity provided via the cold head of the cryocooler. Thus, peak heat loads exceeding the cooling capacity provided via the cold head may favourably be managed or mitigated.

In one aspect of the disclosed magnetic resonance imaging device, the control unit is configured to pre-set a temperature of the at least one thermal bus element in dependence on an imaging sequence to be performed. Preferably, the control unit is configured to pre-set the temperature of the at least one thermal bus element via the adjusting unit.

A pre-set temperature may be characterized by a pre-defined temperature level. The predefined temperature may be set before a magnetic gradient field is generated via the at least one gradient coil. For example, the predefined temperature level may be present just before a magnetic resonance measurement or an imaging sequence is started or performed.

Preferably, the pre-set temperature level of at least one thermal bus element dictates or impacts the temperature level of at least one shield element thermally connected to the at least one thermal bus element. The pre-set temperature level may depend on a known or expected heat load arising within the at least one shield element during the imaging sequence.

It is conceivable, that the control unit is also configured to pre-set a temperature of at least a second thermal bus element and/or a third thermal bus element in dependence on an imaging sequence to be performed. The pre-set temperatures of the at least one thermal bus element, the second thermal bus element, and/or the third thermal bus element may differ from each other.

By pre-setting the temperature level of the at least one thermal bus element, the heat transfer properties of the at least one thermal bus element can favourably be adjusted pre-emptively for different imaging sequences. Thus, temperature control of the plurality of spaced shield elements throughout the imaging sequence may be facilitated.

According to an aspect, the disclosed magnetic resonance imaging device comprises a buffer unit that is thermally connected to the at least one thermal bus element.

Preferably, the buffer unit is configured for storing a cryogen at a low-temperature level. However, the buffer unit may also comprise a solid heat storage medium.

The cryogen may be any fluid selected from the cryogens mentioned above. However, the cryogen may also comprise a mixture of liquid and solid cryogens, such as a mixture of liquid Neon and solid Nitrogen or a mixture of solid Argon and liquid Nitrogen and the like. The buffer unit may be thermally connected to the cold head and/or a secondary cooling device to adjust the temperature of the cryogen stored within the buffer unit. For example, the buffer unit may be thermally connected to the first stage or the second stage of the cold head of the cryocooler. Thus, the buffer unit may be regenerated, i. e. by cooling, solidifying, or condensing the cryogen—depending on the desired phase state and/or temperature. The thermal connection between the buffer unit and the cold head and/or the secondary cooling device may be implemented according to an aspect described above. It is conceivable, that the cryogen stored within the buffer unit is frozen or solid. However, the buffer unit may also comprise liquid cryogen or a liquid fraction of cryogen, or even a gaseous fraction of cryogen.

The control unit is configured to control heat exchange between the buffer unit and the at least one thermal bus element via an adjusting unit.

The adjusting unit may be selected from any of the aspects described above. In one aspect, the adjusting unit is implemented as a heat switch arranged between the buffer unit and the at least one thermal bus element. Thus, the heat switch may enable and/or inhibit a heat transfer between the buffer unit and the thermal bus element. In a further aspect, the adjusting unit may be implemented as a heating unit. The heating unit may be configured to melt the cryogen stored within the buffer unit. Thus, the cryogen may be brought into contact with the thermal bus element when required.

The thermal connection between the buffer unit and the at least one thermal bus element may be implemented as a direct or an indirect thermal connection. In one aspect, the buffer unit and/or the at least one thermal bus element may comprise a heat exchanger configured to provide a thermal connection between the cryogen and the at least one thermal bus element (indirect heat exchange). In a further aspect, the cryogen from the buffer unit may be brought into direct contact with the at least one thermal bus element (direct heat exchange). For example, the control unit is configured to control the heating unit to heat the buffer unit in such a way that the solid cryogen at least partially melts and may be brought into direct or indirect contact with the at least one thermal bus element. For example, the cryogen may flow or drip directly onto the at least one thermal bus element or be fed through pipes connected to a heat exchanger thermally connected to the at least one thermal bus element.

A buffer unit according to the disclosure may favourably be used for increasing the thermal capacity of the thermal bus structure. Preferably, the buffer unit is positioned in proximity to the thermal bus structure and/or the at least one thermal bus element. Thus, the distance between the cold head and the thermal bus structure may be increased without decreasing a rate of heat transfer due to elongated heat conducting paths. As a further advantage, a direct or indirect heat exchange between the cryogen in the buffer unit and the at least one thermal bus element may allow for increased heat transfer rates, thus enabling a prompt adjustment of the temperature level of a shield element via the control unit.

In a preferred aspect, the disclosed magnetic resonance imaging device further comprises a sensor configured for acquiring a sensor signal indicative of a heat transfer property of the at least one thermal bus element and/or at least one shield element.

In a preferred aspect, the sensor is configured to determine a temperature-dependent property of the at least one thermal bus element and/or the at least one shield element. A temperature-dependent property may be an electric voltage, an electric resistance, an electromagnetic radiation (e. g. via thermal imaging), a refractive index, a deformation, a change of volume, a change of an electric current, or the like.

The temperature-dependent property may be indicative of a heat transfer property of the at least one thermal bus element and/or the at least one shield element. The sensor may be configured to transmit the sensor signal to the control unit via a suitable interface. The sensor and/or the control unit may comprise a conversion unit and/or a processing unit configured for processing and/or converting the determined temperature-dependent property. For example, the temperature-dependent property may be converted into a data format suitable for further processing via the control unit and/or for use as an output to other devices. Preferably, the processing unit is configured to determine a required temperature level, and a required heat flow, but also a control signal for an adjusting unit, such as a heating unit, a heat switch, and/or a secondary cooling device, in dependence of the sensor signal.

The control unit is configured to adjust the heat transfer property of the at least one thermal bus element in dependence on the sensor signal.

Preferably, the control unit comprises a processing unit configured to determine a required heat flow and/or change in heat flow along the at least one thermal bus element in dependence on the sensor signal. The control unit may be configured for controlling an adjusting unit according to an aspect described above in dependence on an output provided by the processing unit.

The sensor signal may favourably enable the control unit to quickly and/or reliably adjust a heat flow via the at least one thermal bus element. Thus, undesired changes in the temperature level of the shield element may be limited or prevented.

In a further aspect, the disclosed magnetic resonance imaging device comprises a processing unit configured for determining a heat information regarding at least one shield element in dependence on a model.

The model may be based on an analytical, an experimental and/or a simulative (e. g. numerical, finite elements) representation of the gradient system and/or the electromagnetic shield. It is also conceivable, that the model is based on artificial intelligence, such as an artificial neuronal network, an expert system, a Bayesian network, or the like.

The model may be configured to provide a heat information regarding a first shield element, a second shield element, and/or a plurality of spaced shield elements in dependence on an input. Such an input may comprise, for example, a measurement protocol, an imaging sequence, and/or any information indicative of a gradient function. A gradient function may comprise (time-dependent) information regarding a signal or an electrical current fed through one or more gradient coils of the gradient system.

The heat information may comprise, for example, time-dependent and/or non-time-dependent values of a heat load, a heat load distribution, a cooling capacity, a temperature level, a temperature distribution, and/or a heat transfer property of the at least one shield element. The heat information may further comprise time-dependent and/or non-time-dependent values of a heat load, a cooling capacity, a temperature level, a temperature distribution, and/or a heat transfer property of the thermal bus structure, the at least one thermal bus element and/or the cryocooler. In a preferred aspect, the heat information comprises an expected heat load in one or more shield elements.

The processing unit may be configured to determine the heat information in dependence on a sensor signal indicative of a heat transfer property of the at least one thermal bus element and/or the at least one shield element. In a preferred aspect, the processing unit is configured to provide a real-time or quasi-real-time (e. g. delayed) update on the heat information in dependence on the sensor signal. It is conceivable that the heat information is determined before and/or during an imaging sequence or magnetic resonance measurement.

The control unit is configured to adjust the heat transfer property of the at least one thermal bus element in dependence on the determined heat information.

Preferably, the control unit is configured to pre-set the temperature of the at least one thermal bus element in dependence on the heat information according to an aspect described above. However, the control unit may also be configured to adjust the heat transfer property of the at least one thermal bus element in dependence on the heat information provided via the processing unit during an imaging sequence or magnetic resonance measurement.

In providing a processing unit configured to determine heat information of a shield element in dependence on a model, the accuracy of adapting the heat transfer property of the at least one thermal bus element may favourably be increased. Furthermore, the number of sensors used for acquiring sensor signals indicative of a heat transfer property of the at least one thermal bus element may be reduced, thus reducing costs of the magnetic resonance imaging device. As a further advantage, a-priori knowledge can be helpful because it can provide information about an expected heat load already before the sensors measure it. This can favourably be used to compensate for a delay or a time constants related to heat transfer via the thermal bus elements, the shield elements, and/or the thermal bus structure.

It is to be understood that one or more features of a single aspect described herein may be combined with other aspects without departing from the disclosed idea. For example, the disclosed magnetic resonance imaging device may comprise one or more adjusting units according to any aspect described above. In particular, any aspect described herein may comprise one or more sensors configured for acquiring a sensor signal indicative of a heat transfer property of the at least one thermal bus element, a processing unit configured for determining a heat information regarding at least one shield element in dependence of a model and/or a control unit configured for adjusting a heat transfer property of at least one thermal bus element.

BRIEF DESCRIPTION OF THE DRAWINGS

Further advantages and details of the present disclosure may be recognized from the aspects described below as well as the drawings. The figures show.

DETAILED DESCRIPTION

Figure 1:
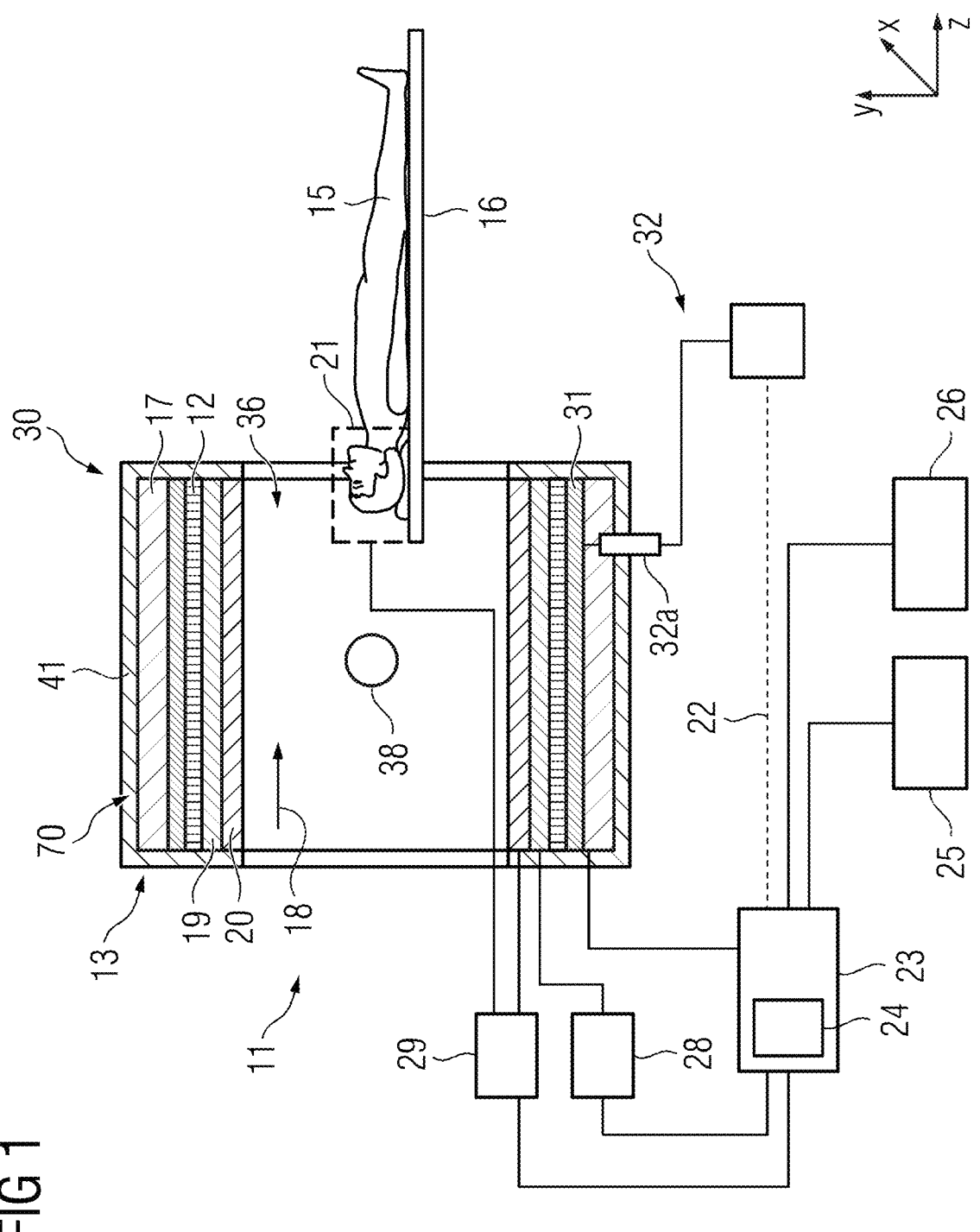
FIG. 1 is a schematic representation of an aspect of a disclosed magnetic resonance imaging device.

FIG. 1 shows an aspect of a magnetic resonance imaging device 11 according to the disclosure. The magnetic resonance imaging device 11 comprises a magnetic resonance imaging device 11 with a static field magnet 17 that provides a homogenous, static magnetic field 18 (B0 field). The static magnetic field 18 comprises an isocenter 38 and a cylindrical imaging region 36 for receiving an imaging object, such as a patient 15. The imaging region 36 is surrounded by the magnet arrangement 30 in a circumferential direction. The patient support 16 is configured to transport the patient 15 into the imaging region 36. In particular, the patient support 16 may transport a diagnostically relevant region of the patient 15 into an imaging volume defined by the isocenter 38 of the magnetic resonance imaging device 11. Preferably, the magnetic resonance imaging device 11 is screened from an environment by a housing shell 41.

The magnetic resonance imaging device 11 further comprises a gradient system 19 configured to provide magnetic gradient fields used for spatial encoding of magnetic resonance signals acquired during a magnetic resonance measurement. The gradient system 19 is activated or controlled by a gradient controller 28 via an appropriate current signal. It is conceivable that the gradient system 19 comprises one or more gradient coils for generating magnetic gradient fields in different, preferably perpendicular, spatial directions. In the aspect shown in FIG. 1, an electromagnetic shield 12 is arranged between the gradient system 19 and the main magnet 17. The electromagnetic shield 12 comprises a plurality of spaced shield elements 12i (see FIGS. 3 and 4) confining the superconducting main magnet 17 in a direction facing towards the gradient system 19. The electromagnetic shield 12 is configured to shield the main magnet 17 from magnetic gradient fields provided by the one or more gradient coils of the gradient system 19.

In a preferred aspect, the magnetic resonance imaging device 11 comprises a radiofrequency antenna 20 (body coil), which may be integrated into the magnetic resonance imaging device 11. The radiofrequency antenna 20 is operated via a radiofrequency controller 29 that controls the radiofrequency antenna 20 to generate a high-frequency magnetic field and emit radiofrequency excitation pulses into an examination space, which is essentially formed by the imaging region 36. The magnetic resonance imaging device 11 may further comprise a local coil 21, which is positioned on or in proximity to the diagnostically relevant region of the patient 15. The local coil 21 may be configured to emit radiofrequency excitation pulses into the patient 15 and/or receive magnetic resonance signals from the patient 15. It is conceivable, that the local coil 21 is controlled via the radiofrequency controller 29.

The magnetic resonance imaging device 11 further comprises a control unit 23 configured to control the magnetic resonance imaging device 11. The control unit 23 may comprise a processing unit 24 configured to process magnetic resonance signals and reconstruct magnetic resonance images. The processing unit 24 may also be configured to process input from a user of the magnetic resonance imaging device 11 and/or provide an output to a user. For this purpose, the processing unit 24 and/or the control unit 23 can be connected to a display unit 25 and an input unit 26 via a suitable signal connection. For preparation of a magnetic resonance imaging measurement, preparatory information, such as imaging parameters or patient information, can be provided to the user via the display unit 25. The input unit 26 may be configured to receive information and/or imaging parameters from the user. The display unit 25 and the input unit 26 may also be implemented as a combined interface, such as a touch interface.

Figure 3:
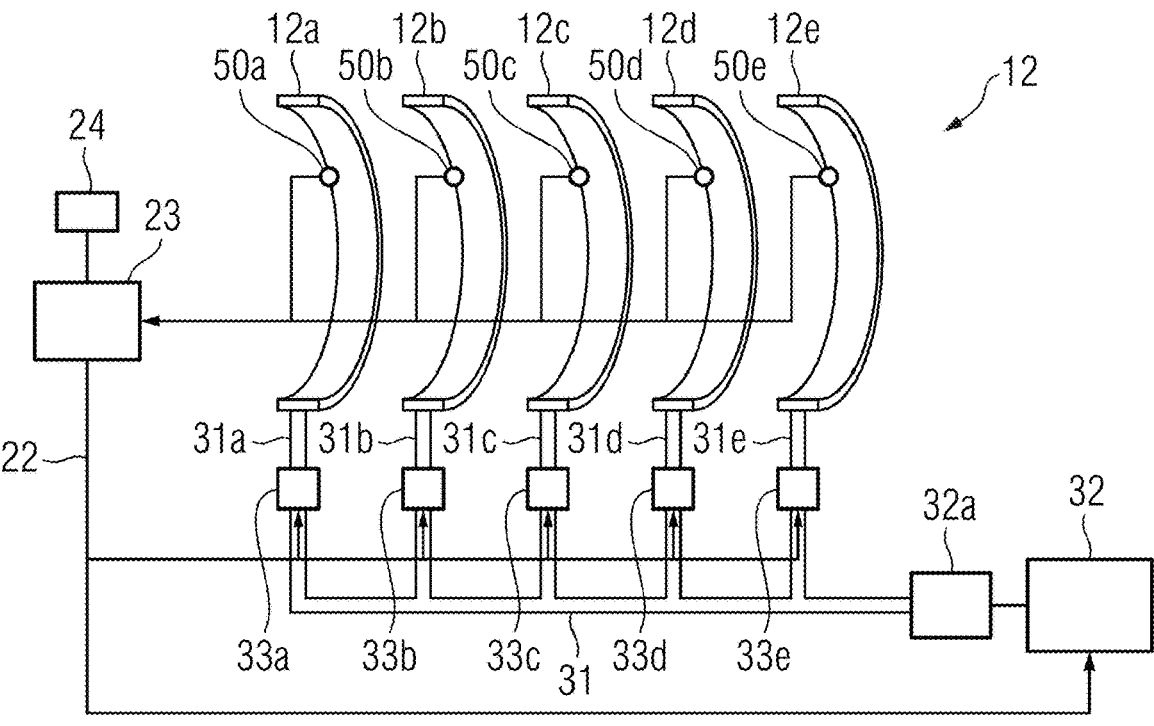
FIG. 3 is a schematic representation of an aspect of an electromagnetic shield of an disclosed magnetic resonance imaging device.
Figure 4:
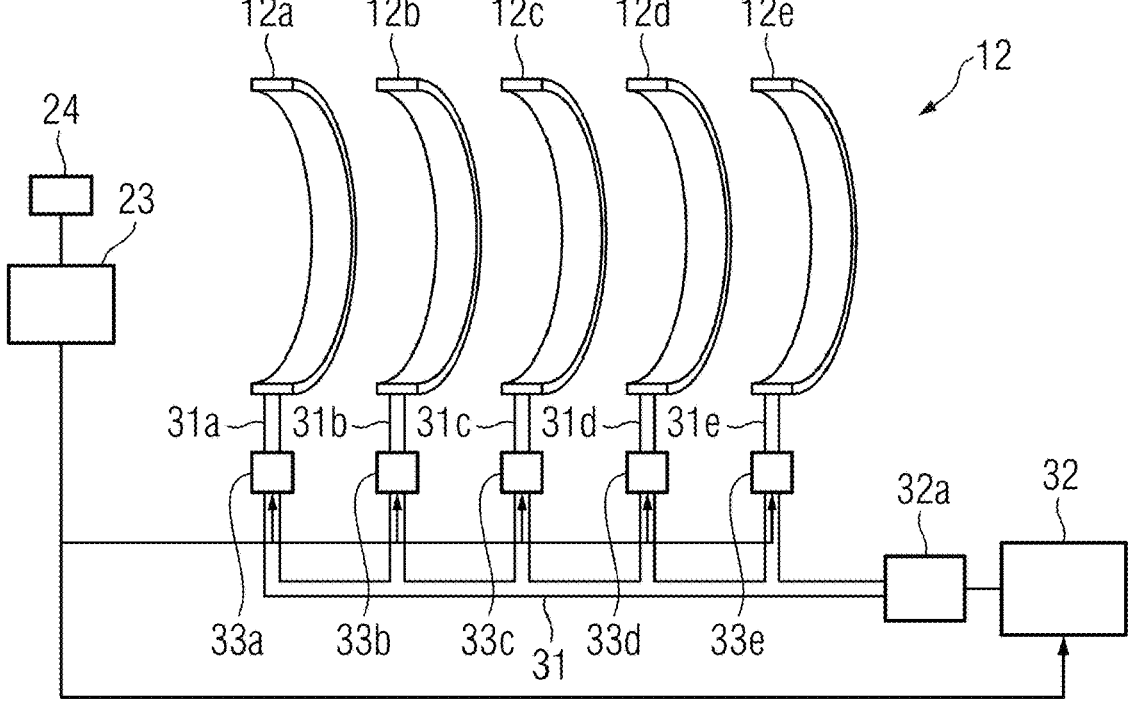
FIG. 4 is a schematic representation of an aspect of an electromagnetic shield of a disclosed magnetic resonance imaging device.

In the example shown in FIG. 1, the control unit 23 is configured to adjust a heat transfer property of at least one thermal bus element 31i of a thermal bus structure 31 (see FIGS. 3 and 4).

Figure 2:
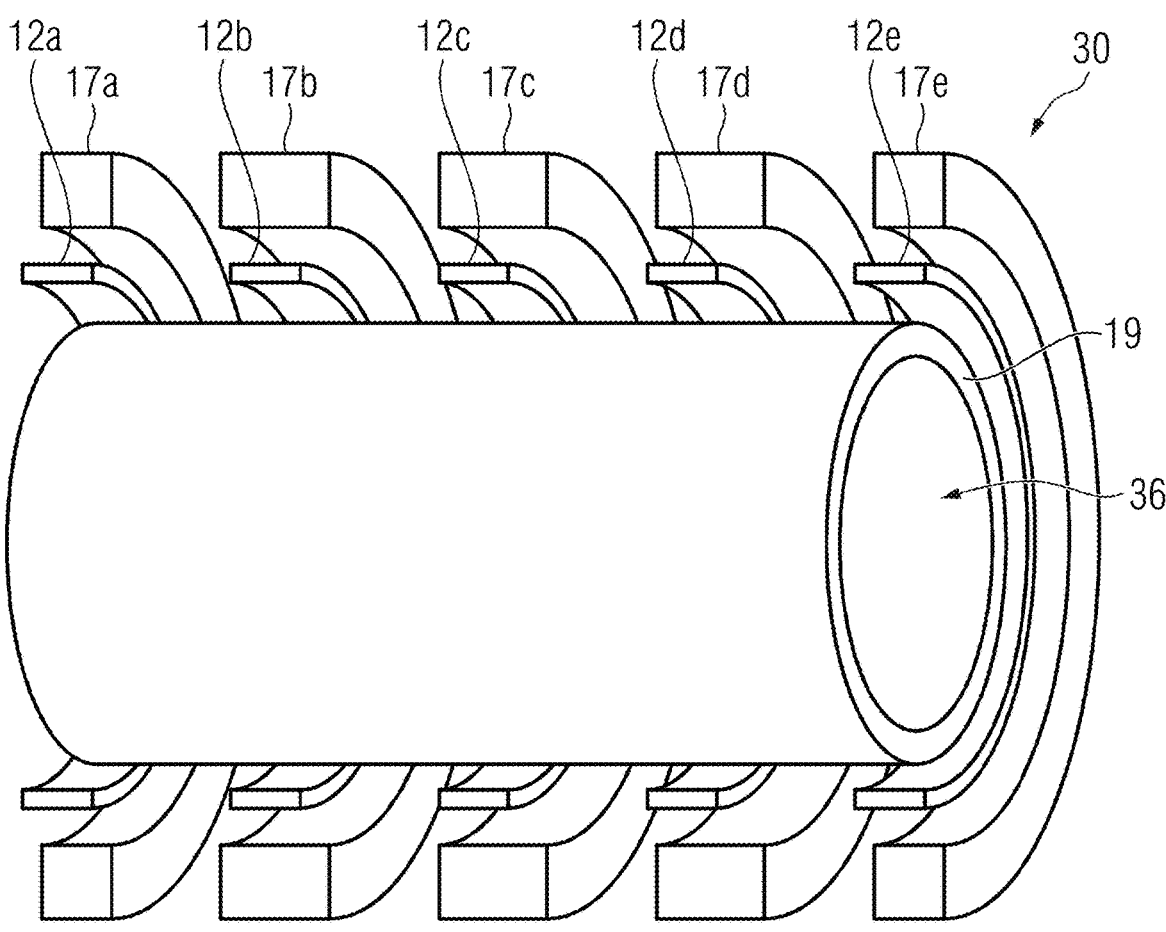
FIG. 2 is a schematic representation of a magnet arrangement of an aspect of a disclosed magnetic resonance imaging device.

In one aspect, the processing unit 24 is configured for determining a heat information regarding at least one shield element 12i (e. g. one of the shield elements 12a, 12b, 12c, 12d, 12e depicted in FIG. 2) in dependence of a model. In this case, the control unit 23 may be configured to adjust a temperature-dependent property of the at least one thermal bus element 31i (e. g. one or more of the thermal bus elements 31a, 31b, 31c, 31d, 31e depicted in FIG. 3) in dependence of the determined heat information.

The magnetic resonance imaging device 11 further comprises a cryocooler 32 configured to cool coils of a superconducting main magnet 17 in the magnet arrangement 30 below a superconducting temperature. The cryocooler 32 may comprise a compressor supplying pressurized gas to the cryocooler 32. According to the aspect shown in FIG. 1, the cryocooler 32 includes a cold head 32a comprising one or more cooling stages (not shown). Preferably, a first stage of the cold head 32a is thermally connected to the thermal bus structure 31, while a second stage of the cold head 32a is thermally connected to the main magnet 17. In an alternative aspect, the thermal bus structure 31 and the main magnet 17 may be thermally connected to the same stage of the cold head 32a.

In the aspect shown in FIG. 1, the cryocooler 32 comprises a signal connection 22 with an interface (not shown) of the control unit 23. The signal connection 22 may be configured for transmitting information from the cryocooler 32 to the control unit 23 and vice versa. Such information may, for example, comprise control signals, but also information indicating operating parameters of the compressor of the cryocooler 32 and/or sensor signals (i.e., a temperature and/or a pressure of a cryogen in the cold head 32a). The signal connection 22 may be implemented as a wired connection or a wireless connection.

Of course, the magnetic resonance imaging device 11 may comprise further components that magnetic resonance imaging devices usually exhibit. The general operation of a magnetic resonance imaging device 11 is known to those skilled in the art, so a more detailed description is not deemed necessary.

FIG. 2 shows an aspect of the magnet arrangement 30 of the disclosed magnetic resonance imaging device 11. In the depicted example, the shield elements 12a, 12b, 12c, 12d, and 12e (12a-e) are arranged between the coils 17a, 16b, 17c, 17d, and 17e (17a-e) of the superconducting main magnet 17 and the gradient system 19. Each shield element 12i encompasses the gradient system 19 and the imaging region 36 along a circumferential direction. The shield elements 12a-e are arranged in such a way, that each shield element 12i primarily shields a corresponding coil 17i of the main magnet 17. For example, the shield element 12a may primarily shield the coil 17a from a magnetic stray field generated by the gradient system 19. Likewise, the shield element 12*c* may primarily shield the coil 17*c* from magnetic stray fields of the gradient system 19.

As can be seen in FIG. 2, the widths of individual shield elements 12*i* may correspond to the widths of the corresponding coils 17*i* of the main magnet 17. However, one shield element 12*i* may provide a shielding effect for a plurality of coils 17*i* or a part of a coil 17*i* of the main magnet 17. In one example, the axial width of the shield element 12*c* may be less than the axial width of the corresponding coil 17*c*. However, an axial width of a shield element 12*i* may also exceed an axial width of a coil 17*i* of the main magnet 17.

In a preferred aspect, the number of shield elements 12*i* corresponds to the number of coils 17*i* of the main magnet 17. In an alternative aspect, that the number of shield elements 12*i* is less or more than the number of coils 17*i* of the main magnet 17.

FIG. 3 shows a schematic representation of an aspect of the electromagnetic shield 12. The shield elements 12*a-e* are thermally connected to respective thermal bus elements 31*a*, 31*b*, 31*c*, 31*d*, and 31*e* (31*a-e*). The thermal bus elements 31*a-e* are thermally connected to the thermal bus structure 31 which is in turn thermally connected to the cold head 32*a* of the cryocooler 32. Thus, the thermal bus structure 31 may be regarded as a thermal backbone, thermally coupling the shield elements 12*a-e* with the cold head 32*a*.

As shown in FIG. 3, each thermal bus element 31*i* (e. g. one of the thermal bus elements 31*a-e*) may comprise an adjusting unit 33*i* configured for adjusting a heat transfer property of the respective thermal bus element 31*i*. The adjusting unit 31*i* may comprise, for example, a heat switch, a secondary cooling device, a buffer tank, and/or a heating unit according to an aspect described above. It is conceivable that some thermal bus elements 31*i* comprise an adjusting unit 33*i*, whereas others do not comprise an adjusting unit 33. Preferably, each thermal bus element 31*i* comprises the same type of adjusting unit 31*i*. However, the adjusting units 31*i* may also differ. For example, at least two thermal bus elements 31*i* may comprise different adjusting units 31*i*. In one aspect, two or more thermal bus elements 31*i* may also share one or more adjusting units 31, particularly a heating unit, a buffer tank, and/or a secondary cooling device.

In the depicted example, the disclosed magnetic resonance imaging device 11 comprises a plurality of sensors 50*a*, 50*b*, 50*c*, 50*d*, 50*e* (50*a-e*) configured for acquiring sensor signals indicative of a heat transfer property of the shield elements 12*a-e*. It is also conceivable, that the sensors 50*a-e* are positioned in proximity to the thermal bus elements 31*a-e* for acquiring sensor signals indicative of the heat transfer properties of the thermal bus elements 31*a-e*. In one aspect, at least one sensor 50*i* is positioned in proximity to at least one shield element 12*i* and/or at least one thermal bus element 31*i*. The sensors 50*a-e* may be configured according to an aspect described above.

As shown in FIG. 3, the sensors 50*a-e* are connected to the control unit 23 and/or the processing unit 24 via a suitable signal connection. The control unit 23 is configured for controlling the adjusting units 33*a-e* to adjust a heat flow through the thermal bus element 31*a-e* in dependence on the sensor signals of the sensors 50*a-e*. The control unit 23 may be configured to provide control signals to the adjusting units 33*a-e*, but also the cryocooler 32, via one or more signal connections 22.

In one aspect, the acquired sensor signals indicative of the heat transfer properties of the thermal bus elements 31*a-e* and/or the shield elements 12*a-e* are used as an input for a model for determining heat information regarding the shield elements 12*a-e*. For example, the processing unit 24 may be configured to determine an expected heat load in the shield elements 12*a-e* based on the acquired sensor signals.

FIG. 4 shows a schematic representation of a further aspect of the electromagnetic shield 12 of the disclosed magnetic resonance imaging device 11. In the depicted example, the adjusting units 33*a-e* are controlled primarily in dependence on heat information provided via the processing unit 24. Preferably, the heat information is determined via a model according to an aspect described above. In this aspect, sensors 50 can be omitted. However, as described above, the models may also be complemented by sensor signals acquired via sensors positioned in proximity to the shield elements 12*a-e* and/or the thermal bus elements 31*a-e*.

In each aspect, the control unit 23 may be configured to pre-set a temperature of the thermal bus elements 31*a-e* and/or the shield elements 12*a-e* before an imaging sequence or a magnetic resonance measurement is performed. Preferably, the control unit 23 is configured to adjust heat transfer properties of the thermal bus elements 31*a-e* via the adjusting units 33*a-e*.

Figure 5:
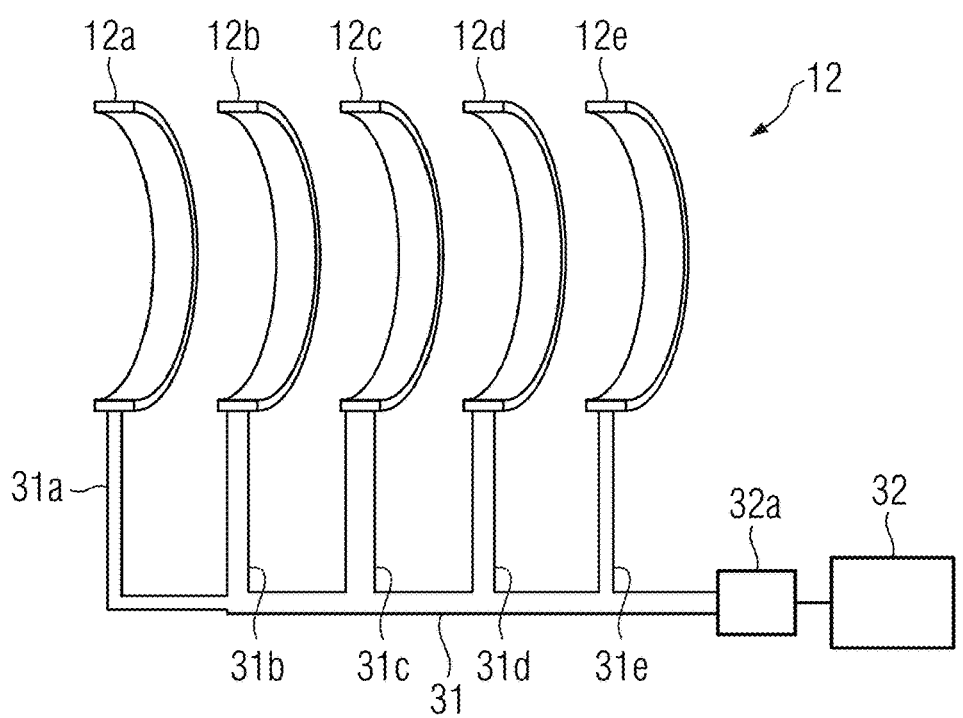
FIG. 5 is a schematic representation of an aspect of an electromagnetic shield of a disclosed magnetic resonance imaging device.

FIG. 5 shows yet another schematic representation of an aspect of the electromagnetic shield 12 of the disclosed magnetic resonance imaging device 11. In the depicted aspect, the thermal bus elements 31*a-e* comprise differing material properties. For example, the thermal bus elements may consist of solid aluminium rods with different diameters and/or material strengths. As shown in FIG. 5, the thermal bus element 31*c* may have a larger diameter than the thermal bus elements 31*b* and 31*c* or 31*a* and 31*e*. Thus, the thermal bus element 31*c* may exhibit a lower thermal resistance and/or higher heat transfer coefficient to compensate for higher heat loads expected within the coil 12*c* of the main magnet 17. It is also conceivable, that some thermal bus elements 31*i* have different material purities, different shapes, and/or bridge different distances between the thermal bus structure 30 and the respective shield element 12*i* in order to achieve a desirable heat transfer property.

In FIGS. 3 to 5, the thermal bus elements 31*a-e* and the thermal bus structure 31 are depicted as straight lines. It is to be understood that the thermal bus elements 31*a-e* and/or the thermal bus structure 31 may comprise one or more curves, one or more angles as well as one or more tapered sections. Furthermore, the thermal bus elements 31*a-e* may also comprise or consist of heat pipes instead of or in addition to solid thermal conductors.

Figure 6:
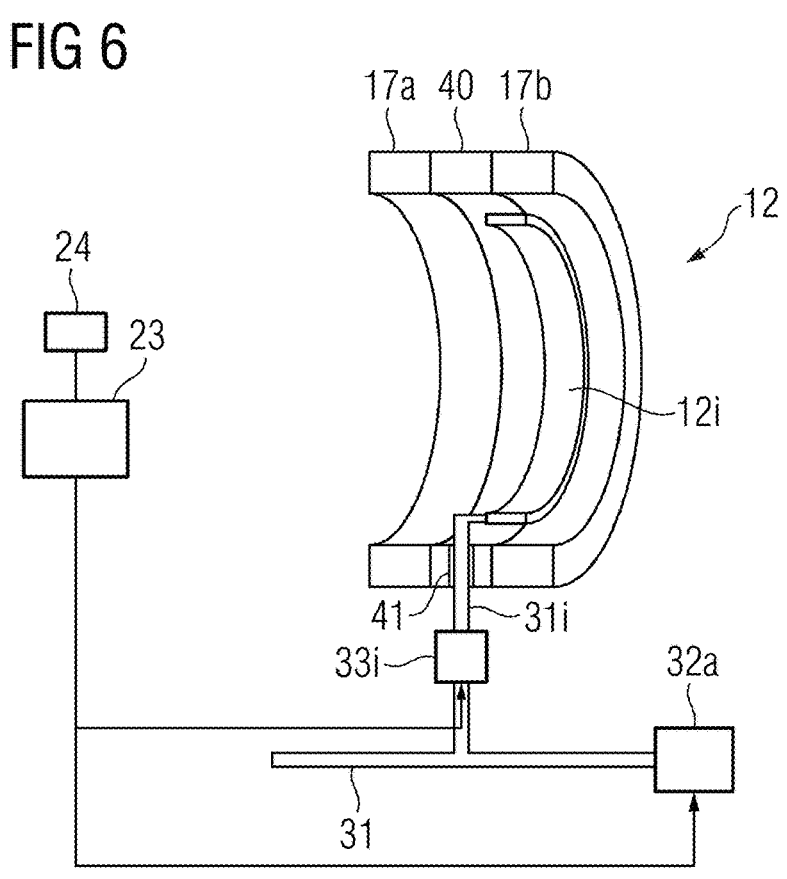
FIG. 6 is a schematic representation of an aspect of a magnet arrangement of a disclosed magnetic resonance imaging device.

FIG. 6 shows an aspect of the disclosed magnetic resonance imaging device, wherein the coils 17*i* of the main magnet 17 are spaced apart by a magnet spacer 40. The magnet spacer 40 is configured to divide or separate individual coils 17*a* and 17*b* of the main magnet 17. In the shown aspect, at least one thermal bus element 31*i* extends through a hole or cavity 41 in the magnet spacer 40 to thermally connect the cold head 32*a* of the cryocooler to the shield element 12*i*.

The magnet spacer 40 may be designed according to an aspect described above. In the depicted example, the cavity 41 in the magnet spacer 40 comprises a substantially cylindrical shape. However, other shapes are also possible. Preferably, an inner surface of the cavity 41 and/or an outer surface of the thermal bus element comprises a thermally insulating layer (not shown). The thermally insulating layer is configured to reduce or minimize a heat exchange between the magnet spacer 40 and the thermal bus element 31*i*. The disclosed magnetic resonance imaging device 11 may comprise a plurality of magnet spacers 40, each magnet spacer 40 having at least one cavity 41. It is also conceivable that a number of cavities 41 is lower than a number of magnet spacers 40. For example, the main magnet 17 may only comprise one or two cavities 41. In one aspect, a section of the thermal bus structure 31 may extend through the one or two cavities 41 in the magnet spacer 40. Thus, the thermal bus elements 31*i* may be arranged entirely within a volume encompassed by the main magnet 17.

Figure 7:
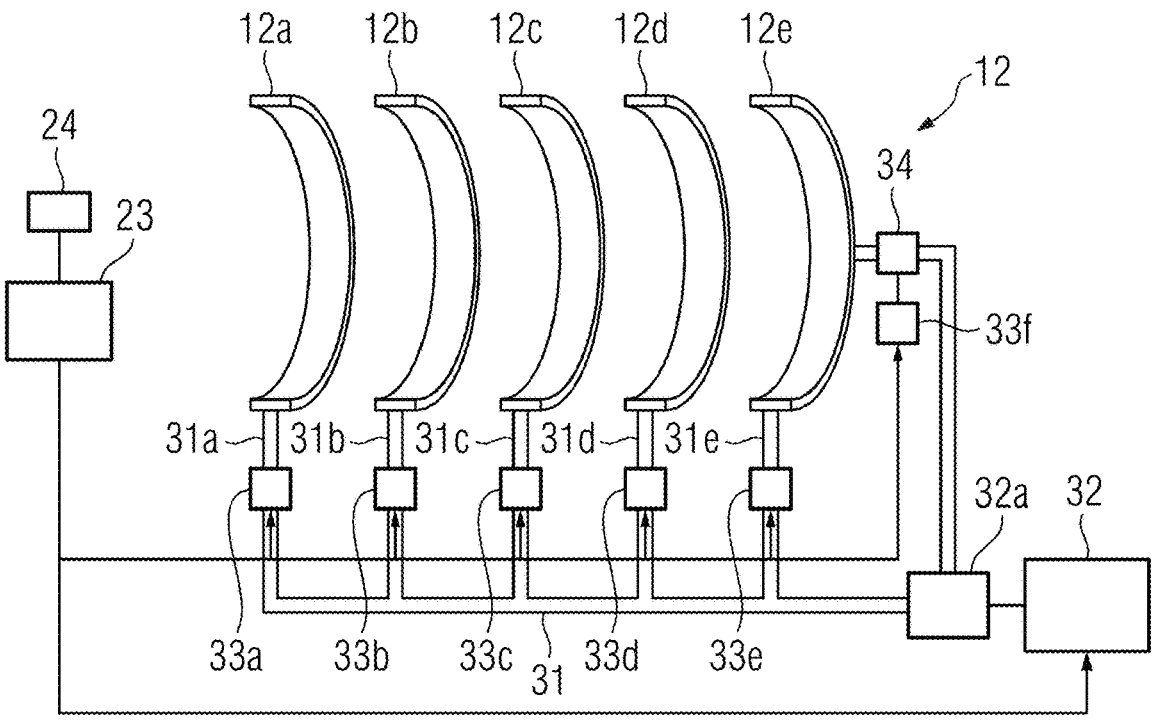
FIG. 7 is a schematic representation of an aspect of a magnet arrangement of a disclosed magnetic resonance imaging device.

FIG. 7 shows a further schematic representation of an aspect of the electromagnetic shield 12 of the disclosed magnetic resonance imaging device 11. In the depicted example, a heating unit 33*f* is connected to a buffer unit 34. The buffer unit 34 comprises a cryogen, which can be melted or fluidized when heated via the heating unit 33*f*. Thus, the fluidized cryogen may be brought into direct or indirect thermal contact with a shield element 12*i* (as shown in FIG. 7). For example, the fluidized cryogen may be brought into thermal contact with the shield element 12*i* via a heat exchanger. However, the fluidized cryogen may also be allowed to drip onto the shield element 12*i*, thus cooling the shield element 12*i*. Preferably, the cryogen within the buffer unit 34 is cooled and/or solidified via a thermal connection with the cold head 32*a*. Of course, the buffer unit 34 may be arranged in such a way as to provide a thermal connection between the cryogen and the thermal bus element 31*i* and/or a section of the thermal bus structure instead of or in addition to the shield element 12*i*.

In another aspect not depicted in FIG. 7, the adjusting unit 33*f* is implemented as a heat switch, positioned along a thermal connection between the buffer unit 34 and a thermal bus element 31*i*, a shield element 12*i*, and/or a section of the thermal bus structure 31. In this aspect, a heat exchange between the cryogen of the buffer unit 34 and the thermal bus element 31*i*, the shield element 12*i*, and/or the section of the thermal bus structure 31 may be controlled via the heat switch.

Figure 8:
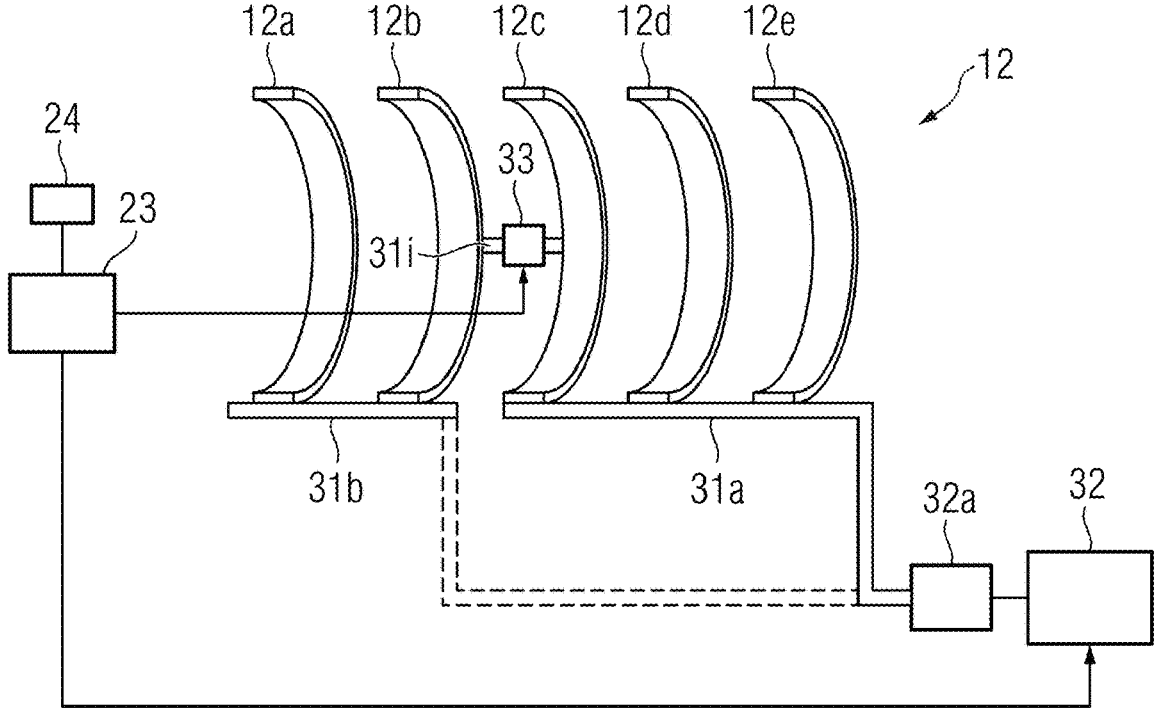
FIG. 8 is a schematic representation of an aspect of a magnet arrangement of a disclosed magnetic resonance imaging device.

FIG. 8 shows a further aspect of a magnet arrangement 30 of a disclosed magnetic resonance imaging device 11. In the depicted example, the thermal bus structure 31 comprises one thermal bus element 31*i* which provides a thermal connection between the shield element 12*b* and the shield element 12*c*. It is conceivable that the thermal bus element 31*i* comprises an adjusting unit 33 for adjusting a heat flow between the shield element 12*b* and the shield element 12*c*. The magnet arrangement may comprise further thermal bus elements 31*i*, each providing a thermal connection between two or more shield elements 12*i*. As can be seen in FIG. 8, the thermal bus element 31*i* may thermally connect the shield elements 12*b* and the cold head 32*a* of the cryocooler 32 without having a direct connection to the thermal bus structure 31.

As can be seen in the depicted example, the thermal bus structure thermally connecting the shield elements 12*a-e* and the thermal bus element 31*i* to the cold head 32*a* may comprise two or more separate branches or structures connected to the shield elements 12*a-e* in different locations or at different positions. The dashed line indicates that a second branch of the thermal bus structure 31 is an optional feature, which may be implemented in any aspect described herein.

The aspects described above are to be recognized as examples. It is to be understood that individual aspects may be extended by or combined with features of other aspects if not stated otherwise.

The invention claimed is:

1. A magnetic resonance imaging device, comprising:
a main magnet;

a gradient system with at least one gradient coil;
a cryocooler;
a thermal bus structure; and
an electromagnetic shield arranged between the gradient system and the main magnet,
wherein the electromagnetic shield comprises a plurality of spaced shield elements confining the main magnet in a direction facing towards the gradient system and wherein the electromagnetic shield is configured to provide electromagnetic shielding of the main magnet from a magnetic field generated by the at least one gradient coil, and
wherein the thermal bus structure comprises a plurality of thermal bus elements configured to provide a thermal connection between the plurality of spaced shield elements and a cold head of the cryocooler, at least two thermal bus elements of the plurality of thermal bus elements comprise different heat transfer properties to provide individualized temperature control of the plurality of spaced shield elements, and the plurality of thermal bus elements consist of solid thermal conductors.

2. The magnetic resonance imaging device according to claim 1, wherein a heat transfer property of a thermal bus element is characterized by a thermal conductivity, a thermal resistance, a thermal insulance, a heat transfer coefficient, a material, a material composition, a shape, and/or a temperature of the bus element.

3. The magnetic resonance imaging device according to claim 1, wherein a first heat transfer property of a first thermal bus element thermally connected to a first shield element of the plurality of spaced shield elements differs from a second heat transfer property of a second thermal bus element thermally connected to a second shield element of the plurality of spaced shield elements.

4. The magnetic resonance imaging device according to claim 1, wherein the cold head comprises at least a first stage and a second stage, wherein a first mean temperature of the first stage exceeds a second mean temperature of the second stage, and the thermal bus structure is thermally connected to the first stage of the cold head.

5. The magnetic resonance imaging device according to claim 1, wherein the main magnet comprises a magnet spacer configured to space individual coils of the main magnet, and at least a section of the thermal bus structure extends through the magnet spacer to provide a thermal connection between the cold head of the cryocooler and the electromagnetic shield.

6. The magnetic resonance imaging device according to claim 1, further comprising:
a controller; and
an adjusting unit,
wherein the controller is configured to adjust a heat transfer property of at least one thermal bus element via the adjusting unit.

7. The magnetic resonance imaging device according to claim 6, wherein the adjusting unit comprises a heater thermally connected to the at least one thermal bus element and configured to heat the at least one thermal bus element, wherein the controller is configured to control the heater to adapt a heat flow between the heater and the at least one thermal bus element.

8. The magnetic resonance imaging device according to claim 6, wherein the adjusting unit comprises a heat switch configured to inhibit a heat flow along the at least one thermal bus element, and the controller is configured to control the heat flow along the at least one thermal bus element via the heat switch.

9. The magnetic resonance imaging device according to claim 6, wherein the adjusting unit comprises a secondary cooling device thermally connected to the at least one thermal bus element, and the controller is configured to control the secondary cooling device to adjust a heat flow between the secondary cooling unit and the at least one thermal bus element.

10. The magnetic resonance imaging device according to claim 6, wherein the controller is configured to pre-set a temperature of the at least one thermal bus element in dependence on an imaging sequence to be performed.

11. The magnetic resonance imaging device according to claim 6, further comprising:

a buffer thermally connected to the at least one thermal bus element, wherein the controller is configured to control a heat exchange between the buffer and the at least one thermal bus element via the adjusting unit.

12. The magnetic resonance imaging device according to claim 6, further comprising:

a sensor configured to acquire a sensor signal indicative of a heat transfer property of the at least one thermal bus element and/or at least one shield element of the plurality of spaced shield elements, wherein the controller is configured to adjust the heat transfer property of the at least one thermal bus element in dependence of the sensor signal.

13. The magnetic resonance imaging device according to claim 6, further comprising:

a processor configured to determine a heat information regarding at least one shield element in dependence of a model, wherein the controller is configured to adjust the heat transfer property of the at least one thermal bus element in dependence of the determined heat information.

\* \* \* \* \*